(12) United States Patent
Beyerle

(10) Patent No.: US 11,806,983 B2
(45) Date of Patent: Nov. 7, 2023

(54) GRAPHITE ARTICLE AND METHOD OF MAKING SAME

(71) Applicant: NEOGRAF SOLUTIONS, LLC, Lakewood, OH (US)

(72) Inventor: Richard A. Beyerle, North Royalton, OH (US)

(73) Assignee: NEOGRAF SOLUTIONS, LLC, Lakewood, OH (US)

(*) Notice: Subject to any disclaimer, the term of this patent is extended or adjusted under 35 U.S.C. 154(b) by 95 days.

(21) Appl. No.: 16/769,491

(22) PCT Filed: Jan. 11, 2019

(86) PCT No.: PCT/IB2019/050231
§ 371 (c)(1),
(2) Date: Jun. 3, 2020

(87) PCT Pub. No.: WO2019/142082
PCT Pub. Date: Jul. 25, 2019

(65) Prior Publication Data
US 2020/0384731 A1    Dec. 10, 2020

Related U.S. Application Data

(60) Provisional application No. 62/695,079, filed on Jul. 8, 2018, provisional application No. 62/620,464, filed on Jan. 22, 2018.

(51) Int. Cl.
*B32B 9/00* (2006.01)
*B32B 3/28* (2006.01)
(Continued)

(52) U.S. Cl.
CPC ............... *B32B 9/007* (2013.01); *B32B 3/28* (2013.01); *B32B 7/12* (2013.01); *B32B 9/04* (2013.01);
(Continued)

(58) Field of Classification Search
CPC ..... Y10T 428/24628; Y10T 428/24669; Y10T 428/24686; Y10T 428/24694;
(Continued)

(56) References Cited

U.S. PATENT DOCUMENTS 5,372,187 A * 12/1994 Haushalter ............... F28F 3/025
165/109.1
2003/0155103 A1* 8/2003 Barten .................... F28F 3/025
165/80.3
(Continued)

FOREIGN PATENT DOCUMENTS

CN          1622879 A      6/2005
CN          1683131 A     10/2005
(Continued)

OTHER PUBLICATIONS

English Abstract (Espacenet) of CN 106358361 A. (Year: 2021).*
(Continued)

*Primary Examiner* — Maria V Ewald
*Assistant Examiner* — Ethan A. Utt
(74) *Attorney, Agent, or Firm* — CALFEE, HALTER & GRISWOLD LLP

(57) ABSTRACT

A graphite article formed of a creped graphite sheet is provided. The creped graphite sheet has a first major surface and a second major surface oppositely disposed to the first major surface and a plurality of macrofolds, each macrofold having a plurality of associated microfolds, wherein each microfold is smaller than the associated macrofold. The creped graphite article has improved flexibility as compared to a graphite sheet which has not been creped. The creped graphite sheet can be formed of a sheet of flexible natural graphite or a sheet of synthetic graphite.

14 Claims, 17 Drawing Sheets

(51) Int. Cl.
  B32B 9/04     (2006.01)
  C01B 32/205   (2017.01)
  B32B 7/12     (2006.01)
  B32B 38/00    (2006.01)
  C01B 32/21    (2017.01)
(52) U.S. Cl.
  CPC ........ B32B 38/0012 (2013.01); C01B 32/205 (2017.08); C01B 32/21 (2017.08); *B32B 2307/302* (2013.01); *B32B 2307/306* (2013.01); *B32B 2307/51* (2013.01); *B32B 2307/54* (2013.01); *B32B 2307/732* (2013.01); *C01P 2006/32* (2013.01)
(58) Field of Classification Search
  CPC ............... Y10T 428/26; Y10T 428/266; Y10T 428/268; Y10T 428/30; B32B 3/00; B32B 3/26; B32B 3/28; B32B 3/30; B32B 9/00; B32B 9/005; B32B 9/007; H01L 23/00; H01L 23/34; H01L 23/36; H01L 23/367; H01L 23/3672; H01L 23/373; H01L 23/3731; H01L 23/3733; F28F 21/00; F28F 21/02; F28F 2225/06; F28F 2215/00; F28F 2215/10; F28F 3/00; F28F 3/02; F28F 3/025; F28F 3/04; F28F 3/042; F28F 3/044; F28F 3/046; F28F 3/048; H01M 10/00; H01M 10/60; H01M 10/65; H01M 10/66; H01M 10/6551

USPC ....... 428/174, 179, 181, 182, 220, 332, 337, 428/338, 408
See application file for complete search history.

(56) References Cited

U.S. PATENT DOCUMENTS

| | | | |
|---|---|---|---|
| 2007/0053168 A1* | 3/2007 | Sayir ..................... | C04B 35/522 361/718 |
| 2015/0189792 A1 | 7/2015 | Kenna et al. | |
| 2016/0077074 A1* | 3/2016 | Strong ............... | G01N 33/0037 428/184 |
| 2017/0006736 A1 | 1/2017 | Kenna et al. | |

FOREIGN PATENT DOCUMENTS

| | | | |
|---|---|---|---|
| CN | 104591163 A | | 5/2015 |
| CN | 106358361 A | * | 1/2017 |
| CN | 107148669 A | | 9/2017 |
| DE | 10 2014 101358 A1 | | 8/2015 |
| WO | 2014149189 | | 9/2014 |

OTHER PUBLICATIONS

International Search Report from PCT/IB2019/050231 dated Apr. 17, 2019 (3 pages).
Office Action from Chinese Application No. 201980005723.1 dated Oct. 22, 2021 (14 pages).

* cited by examiner

GRAPHITE ARTICLE AND METHOD OF MAKING SAME

This application is the U.S. national stage entry of PCT/IB2019/050231, with an international filing date of Jan. 11, 2019, which claims benefit of and priority to U.S. Provisional Application No. 62/620,464, filed on Jan. 22, 2018, and U.S. Provisional Application No. 62/695,079, filed on Jul. 8, 2018, the entire contents of which are incorporated by reference herein.

The article described herein relates generally to the field of graphite articles, in particular 3-dimensional graphite articles formed from a sheet by a creping process.

TECHNICAL BACKGROUND

Graphite articles have been used in the thermal management for various devices. Such prior uses of graphite have included the dissipation of heat in the z direction (through the plane of the article) away from the heat source or the spreading of heat in x-y direction (within the plane of the article) away from a hot spot exhibited on the heat source.

DETAILED DESCRIPTION

Figure 1A:
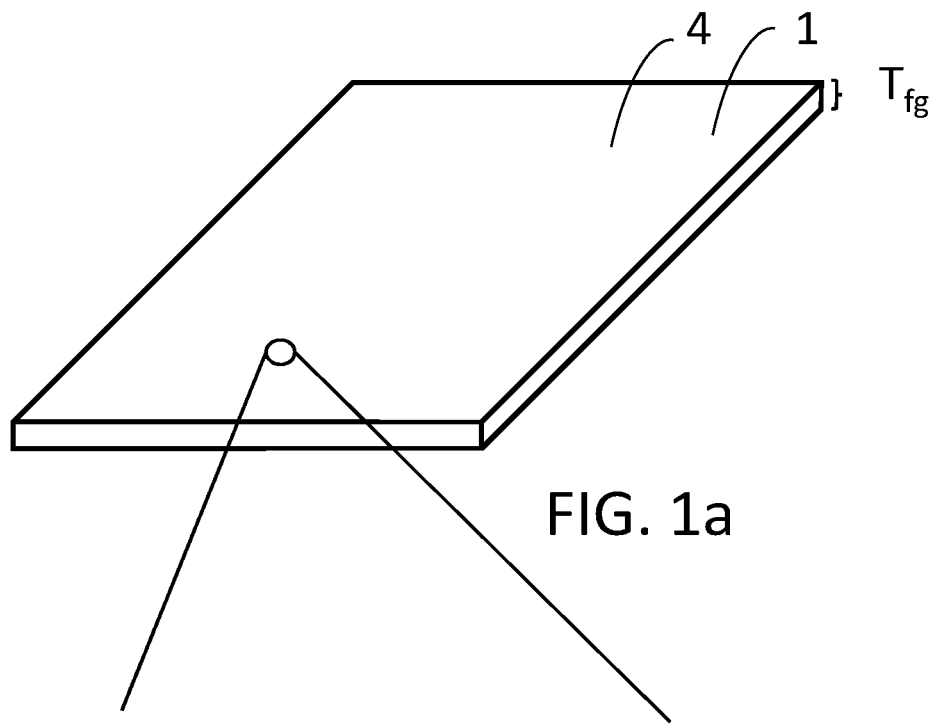
FIGS. 1a-1b illustrate a flexible graphite sheet prior to being creped.
Figure 1B:
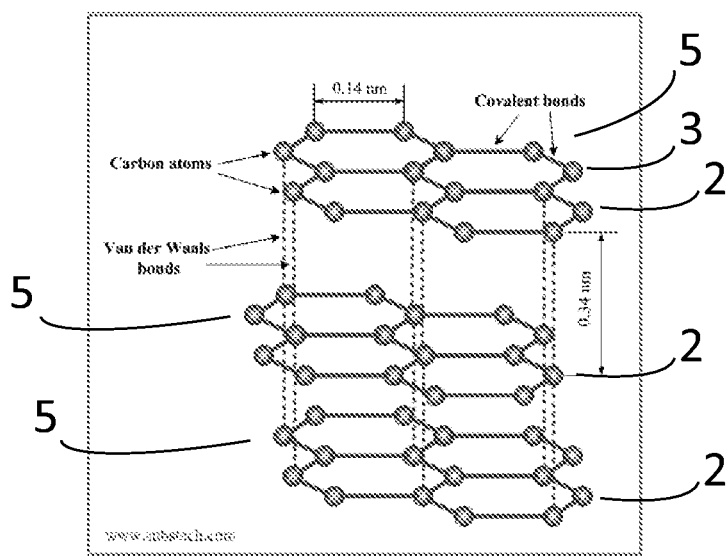

Referring now to FIGS. 1a and 1b, graphites 1 are made up of layer planes 2 of hexagonal arrays or networks or crystals of carbon atoms 3. These layer planes 2 of hexagonally arranged carbon atoms 3 are substantially flat and are oriented or ordered so as to be substantially parallel and equidistant to one another. The substantially flat, parallel equidistant layers of carbon atoms, usually referred to as graphene layers or basal planes, are linked or bonded together and groups thereof are arranged in crystallites. Highly ordered graphites consist of crystallites of considerable size, the crystallites being highly aligned or oriented with respect to each other and having well-ordered carbon layers. In other words, highly ordered graphites have a high degree of preferred crystallite orientation. It should be noted that graphites possess anisotropic structures and thus exhibit or possess many properties that are highly directional such as thermal and electrical conductivity.

Briefly, a flexible graphite sheet shown generally at 4 may be characterized as laminated structures of carbon 5, that is, structures consisting of superposed layers or laminae 2 of carbon atoms 3 joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets 4 possess a very high degree of orientation.

As noted above, the bonding forces holding the parallel layers of carbon atoms together are only weak van der Waals forces. Natural graphite can be treated so that the spacing between the superposed carbon layers or laminae can be appreciably opened up so as to provide a marked expansion in the direction perpendicular to the layers, that is, in the "c" direction, and thus form an expanded or intumesced graphite structure in which the laminar character of the carbon layers is substantially retained.

Graphite flake which has been greatly expanded and more particularly expanded so as to have a final thickness or "c" direction dimension which is as much as about 80 or more times the original "c" direction dimension can be formed without the use of a binder into cohesive or integrated sheets of expanded graphite, e.g. webs, papers, strips, tapes, foils, mats or the like (typically referred to as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material 4, as noted above, has also been found to possess a high degree of anisotropy with respect to thermal conductivity due to orientation of the expanded graphite particles and graphite layers substantially parallel to the opposed faces of the sheet resulting from high compression, making it especially useful in heat spreading applications. Sheet material 4 thus produced is flexible, has good strength and a high degree of orientation.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material 4 can be within the range of from about 0.04 g/cc to about 2.0 g/cc.

The flexible graphite sheet 4 exhibits an appreciable degree of anisotropy due to the alignment of graphite particles parallel to the major opposed, parallel surfaces of the sheet, with the degree of anisotropy increasing upon compression of the sheet material to increase orientation. In compressed anisotropic sheets 4, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal and electrical properties of the sheet are very different, by orders of magnitude, for the "c" and "a" directions.

Figure 2:
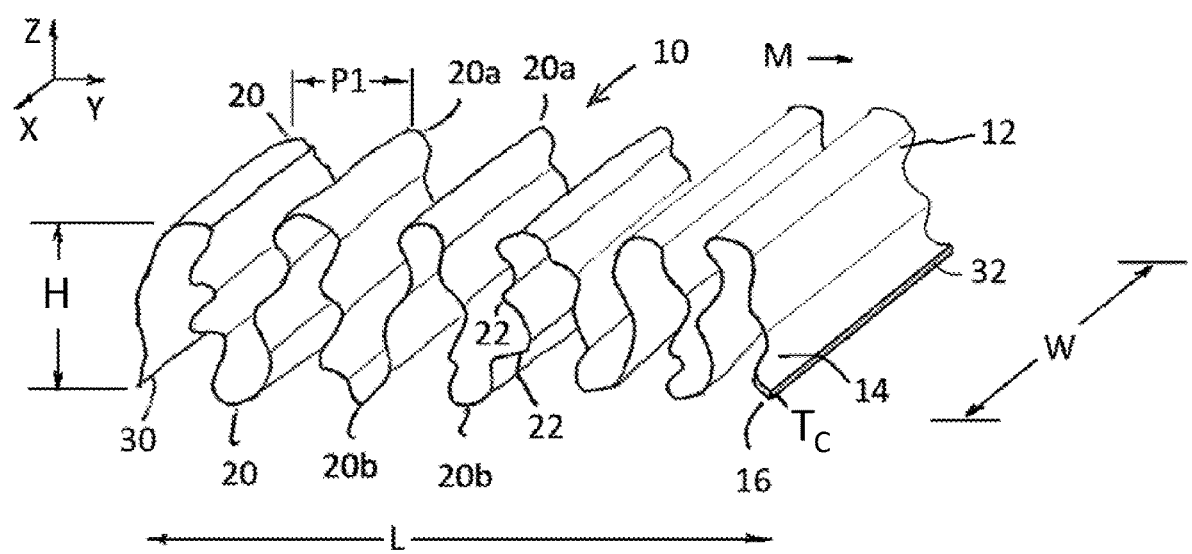
FIG. 2 illustrates a graphite article formed by creping a graphite sheet.

Referring now to FIG. 2, a three-dimensional graphite article as described herein is shown generally at 10. In one or more examples, the graphite article 10 can be formed of a flexible graphite sheet 4 which has been creped, as described in further detail below, to form a creped graphite sheet 12.

One embodiment of flexible graphite sheet 4 is a sheet of compressed, exfoliated graphite, especially natural graphite. As discussed above, graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are referred to as "particles of intercalated graphite." Upon exposure to high temperature, the particles of intercalated graphite expand in dimension as much as 80 or more times their original volume in an accordion-like fashion in the "c" direction, i.e. in the direction perpendicular to the crystalline planes of the graphite. The exfoliated graphite particles are vermiform in appearance and are therefore commonly referred to as worms. The worms may be compressed together into flexible sheets which, unlike the original graphite flakes, can be formed and cut into various shapes.

An example of a flexible graphite sheet 4 formed of a natural graphite that may be used in accordance with the present invention is eGRAF® HITHERM™ flexible graphite or eGRAF® SPREADERSHIELD™ flexible graphite available from NeoGraf Solutions LLC of Lakewood, Ohio.

In one or more other examples, the flexible graphite sheet 4 can be formed of synthetic graphite formed of graphitized polymers. The flexible graphite sheet 4 can be produced by pyrolysis of a high-polymer film, also referred to as a pyrolytic graphite sheet. The precursor for the flexible graphite sheet formed of a graphitized polymer can be a polymer film selected from polyphenyleneoxadiazoles (POD), polybenzothiazole (PBT), polybenzobisthiazole (PBBT), polybenzooxazole (PBO), polybenzobisoxazole (PBBO), poly(pyromellitimide) (PI), poly(phenyleneisophthalamide) (PPA), poly(phenylenebenzoimidazole) (PBI), poly(phenylenebenzobisimidazole) (PPBI), polythiazole (PT), and poly(para-phenylenevinylene) (PPV). The polyphenyleneoxadiazoles include poly-phenylene-1,3,4-oxadiazole and isomers thereof. These polymers are capable of conversion into graphite of good quality when thermally treated in an appropriate manner. Although the polymer for the starting film is stated as selected from POD, PBT, PBBT, PBO, PBBO, PI, PPA, PBI, PPBI, PT and PPV, other polymers that can yield graphite of good quality by thermal treatment may also be used.

An example of a flexible graphite sheet 4 formed of a synthetic graphite that may be used in accordance with the present invention is eGRAF® HITHERM™ or eGRAF SPREADERSHIELD available from NeoGraf Solutions LLC of Lakewood, Ohio. Another suitable graphite sheet is a pyrolytic graphite sheet such as Panasonic PGS® available from Matsushita Electric Components Company Ltd., Ceramic Division, Japan.

In one or more examples, the graphite sheet 4 is not foamed graphite.

The graphite article 10 includes a creped graphite sheet 12 having a first major surface 14 and an oppositely disposed second major surface 16, wherein the second major surface is disposed on the opposite side of the sheet as the first major surface. The creped graphite sheet 12 has a thickness $T_C$.

The thickness $T_C$ of the creped graphite sheet 12 formed of natural graphite can be from about 50 microns to about 2 mm. In other examples, the creped flexible graphite sheet 12 has a thickness $T_C$ of from about 75 microns to about 1.5 mm. In still other examples, the creped flexible graphite sheet has a thickness $T_C$ of from about 75 microns to about 500 microns. In still further examples the creped graphite sheet has a thickness $T_C$ of from about 75 microns to about 300 microns. The creped flexible graphite sheet 12 of the claimed invention formed of synthetic graphite preferably has a thickness $T_C$ of about 25 microns to 700 microns. In other examples it has a thickness $T_C$ of about 50 microns to about 600 microns. In still other examples it has a thickness $T_C$ of about 50 microns to about 500 microns.

As used herein, the flexible graphite sheet 4 is considered to be a substantially two dimensional sheet product prior to being creped. The substantially two-dimensional flexible graphite sheet 4 has a thickness $T_{ag}$ which is less than 1 percent (%) of the at least one of sheet's length L extending in one of the x or y direction, or the sheet's width W extending in the other of the x or y direction. In contrast, the graphite article 10 is considered to be a three-dimensional article, having a height H which is substantially greater than the sheet's thickness $T_C$. In one example H is more than 10 times greater than $T_C$. In another example, H is more than 100 times greater than $T_C$, in still another example, H is more than 1000 times greater than $T_C$.

If so desired in an optional embodiment the creped graphite 12 may comprise a laminate with other materials also. Examples of other materials that may be creped along with graphite sheet 4 include metal foils, plastics, paper and thin ceramics.

The three-dimensional article 10 includes a plurality of macrofolds, referred to generally at 20. The macrofolds 20 may include convex macrofolds 20a and concave macrofolds 20b. As used herein "convex" and "concave" are defined with respect to the same surface or the same side.

In one or more examples, the convex macrofolds 20a and concave macrofolds 20b can be alternating. The macrofolds 20 can be regularly or randomly spaced apart. In one or more examples, the convex macrofolds 20a and concave macrofolds 20b can be alternating and regularly spaced. The height $H_1$ of the three-dimensional article can be the distance in the z direction between the highest convex fold 20a and the lowest concave fold 20b. In other examples, the height $H_1$ can be determined using the mean distance between the adjacent convex and concave macrofolds. In other examples, the height $H_1$ can be determined using the median distance between the adjacent convex and concave macrofolds. In examples, in which the convex macrofolds 20a and concave macrofolds 20b alternate at regularly spaced intervals the three-dimensional article includes a pitch $P_1$ defined as a distance between two (2) adjacent peaks. The minimum pitch value $P_1$ will be 2 times the thickness T starting material, the flexible graphite sheet 4. Tensioning the sheet 12 after creping will reduce the height H and increase the pitch value $P_1$. Compressing the creped sheet 12 without constraining it will reduce the height H and increase the pitch value $P_1$. Compressing the creped sheet 12 while constraining it will reduce the height H but will not increase the pitch value $P_1$.

Figure 10:
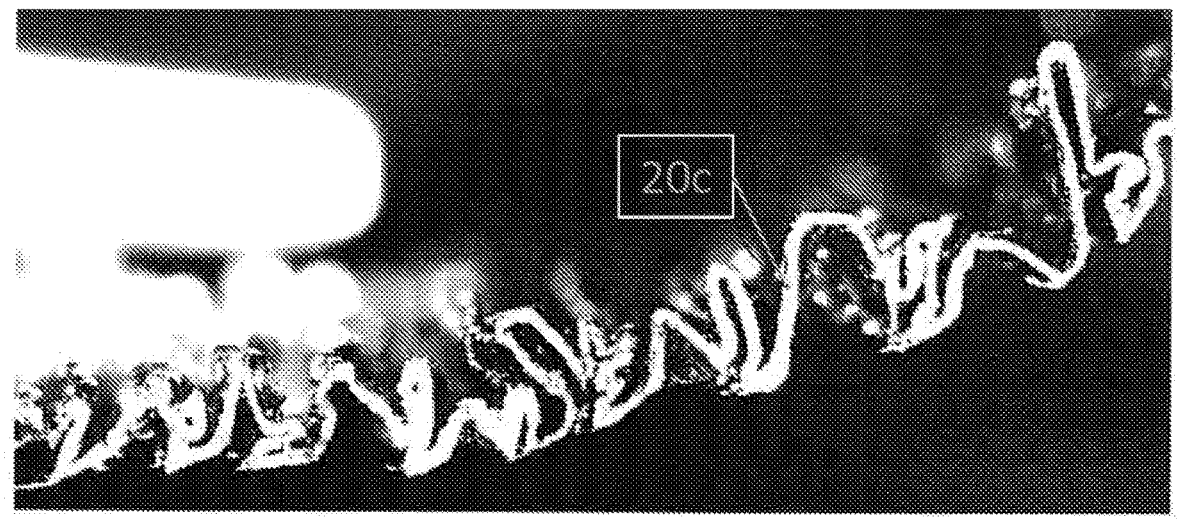
FIG. 10 is an image of one (1) or more macrofolds.

As shown in FIG. 10, the microfold 20 may include a straight section 20c. The length of 20c typically may be similar to about height H. The length of 20c may very between adjacent macrofolds 20, may be uniform or any combination thereof. Typically, length 20c includes one (1) or less microfolds 22.

The macrofolds 20a or 20b, may be uniform, non-uniform or any combination thereof.

Figure 3:
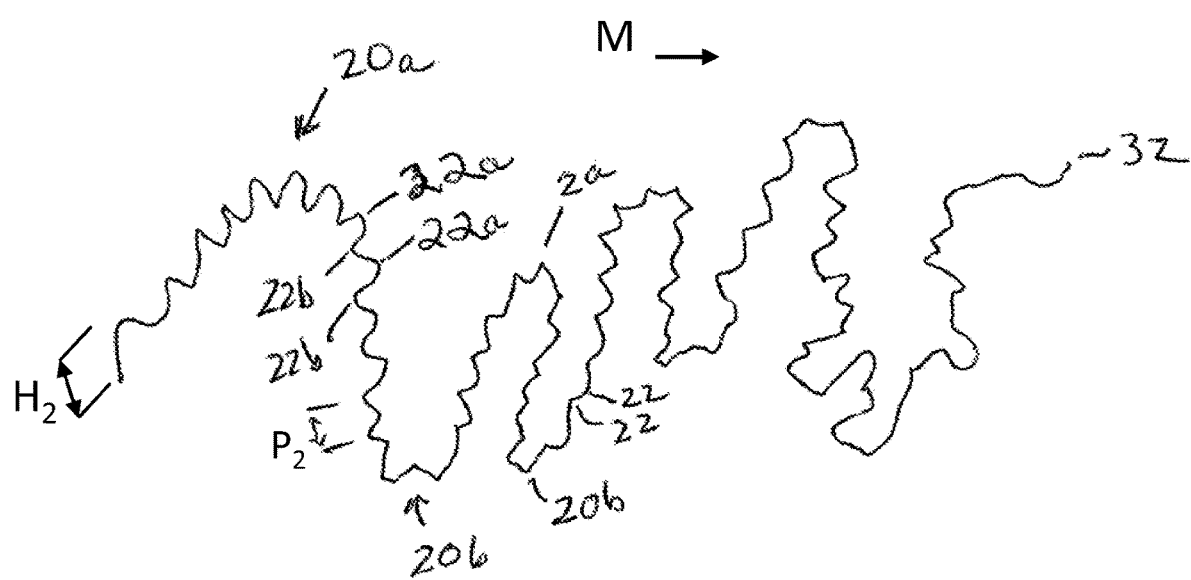
FIG. 3 illustrates a graphite article formed by creping a graphite sheet.

The article 10 also includes a plurality of microfolds 22 which are smaller than the macrofolds 20, with groups of different microfolds 22 disposed between adjacent macrofolds. The concave macrofolds 23 and convex macrofolds 21 can each include microfolds 22, as can be seen in FIG. 3. The convex macrofolds 21, concave macrofolds 23, convex microfolds 22a and concave microfolds 22b can typically best be illustrated by showing the creped sheet in end view, as shown in FIG. 3.

Similar to the macrofolds 20, microfolds 22 may be uniform, non-uniform or any combination thereof.

A macrofold 20 may include one or more microfolds, preferably at least two (2) microfolds 22, more preferably more than (2) microfolds 22.

Regarding the comparison in height between a microfold height $H_2$ to a macrofold height H, typically, the macrofold has a height of at least 2.5 times the height $H_2$ of microfold 22 which is part of the macrofold 20. More preferably, the height ratio between macrofold height H and a microfold height $H_2$ is at least about 3:1.

Comparing the bend radius of the microfold 22 to that of the macrofold 20, typically, the bend radius of macrofold 20 is at least 2.5 times the bend radius of microfold 22.

For all of the above comparisons, the microfold 22 is a microfold which is included in the particular macrofold 20.

The microfolds 22 can be either convex microfolds 22a, concave microfolds 22b, or a combination thereof. In one or more examples, the convex microfolds 22a and concave microfolds 22b can be alternating. The microfolds 22 can be regularly spaced apart. In one or more examples, the convex microfolds 22a and concave microfolds 22b can be alternating and regularly spaced. The height $H_2$ of the microfolds can be determined to be the height difference as measured perpendicular to the process direction between the highest convex microfold 22a and the lowest concave microfold 22b. In other examples, the height $H_2$ can be determined using the mean distance as measured perpendicular to the process direction between the adjacent convex and concave microfolds. In other examples, the height $H_2$ can be determined using the median distance as measured perpendicular to the process direction between the adjacent convex and concave microfolds. In examples, in which the convex microfolds 22a and concave microfolds 22b alternate at regularly spaced intervals the three-dimensional article includes a pitch $P_2$ defined as the distance between adjacent concave microfolds 22b. In other examples, the pitch $P_2$ can be defined as the distance between adjacent convex microfolds 22a.

The pitch size $P_1$ may be engineered as desired based on material properties of the flexible graphite sheet 4 of thickness T, as well as the creping process as described in further detail below. In one non-limiting example, A 25 microns thick synthetic graphite sheet 4, once processed into creped graphite sheet 12 exhibited ten (10) folds per 1 mm. In another example 125 microns thick natural graphite sheet 4 once processed into creped graphite sheet 12 exhibited four (4) folds per 1 mm. Thinner starting materials 4 will likely create a creped graphite sheet 12 with much higher number of folds and a more closely spaced pitch $P_1$. The fold density can be reduced by stretching the creped graphite sheet 12 after creating it.

The three-dimensional article 10 has a length L which extends from a first end 30 to an opposite second end 32 in a process direction M as described in further detail below. In the example shown in FIG. 2, the length L and process direction M are shown as extending along the y axis. The article 10 also includes a width W extending perpendicular to the length and process direction M, along the x direction in this example. In some examples, the length L can be longer than the width W. In other examples the length L can be shorter than the width W. In still other examples the length L=W. In embodiments, the macrofolds 20 and microfolds 22 may extend generally perpendicular to the process direction M.

The three-dimensional article 10 is plastic along its length L, such that the ends 30 and 32 can be pulled apart, that is to say away from each other, without tearing or otherwise compromising the integrity of the creped graphite sheet 12. In the case of a graphitized polymer, the three-dimensional article 10 plasticity enables the creped graphite sheet 12 in one embodiment to be extended along its length L up to about 6 times its original length after creping. In other examples, the three-dimensional article 10 plasticity enables the creped graphite sheet 12 to be extended along its length L by 5 times its original length after creping. In the case a creped exfoliated graphite sheet 12, if the graphite sheet 12 is creped with a plastic carrier, the sheet 12 may also be extended along its length L up to about 6 times its original length after creping. Otherwise, the inventors have observed that the creped exfoliated graphite sheet 12 may be extended along its length L up to about 4 times its original length after creping.

In terms of percentages (%), upon the application tensile force graphite sheet 4 does not elongate more than one (1%) of its length prior to application of the tensile force. As for the graphite sheet 12, it will elongate at least ten (10%) percent of its length prior to the application of the tensile force ("plastic elongation"); other examples of typical plastic elongation of graphite sheet 12 include at least twenty-five (25%) percent, at least fifty (50%), at least one-hundred (100%) percent, at least one-hundred fifty (150%) percent and at least two hundred (200%) percent. At the time of filing, a plastic elongation of up to 300% has been observed.

Upon releasing the load, graphite sheet 12 does exhibit an amount of elastic recovery, such recovery was not significant in length in respect to the plastic deformation.

Beyond the elastic limit the creped sheet 12 will not recover fully to its original length, thereby retaining an extended length greater than its original length after creping. However, no amount of tension will cause the creped sheet 12 to return to its pre-creped flatness and length after the tension is released because the structure of the creped sheet 12 has been permanently deformed by the creping, as described in further detail below.

Under compression in the through plane direction, creped graphite sheet 12 irrecoverably elongated 20% in length, along the process direction M, but not noticeably in width direction W.

In these examples the ends 30, 32 can be pulled apart with a greater force such that the length to which the creped sheet 12 returns (after the force is removed) will be increased over the original length, but the graphite will not be torn or otherwise compromising the integrity of the graphite sheet 12. In other examples the ends 30 and 32 can be pulled apart (that is pulled away from each other in the process direction) with a force below a predetermined yield force such that after the force is removed length L does not change more than a predetermined value.

In comparing the graphite sheet 12 to graphite sheet 4, graphite sheet 12 may have a thickness of at least about four (4×) that of graphite sheet 4. In typical examples, the thickness can increase by a factor of at least about 15(×) times. To date the greatest increase in thickness achievable has been about thirty-five (35×) times. It is not believed that graphite sheet 12 can be sufficiently stretched so that graphite sheet 12 will have substantially the same thickness as graphite sheet 4. Thickness of article 10 may be measured with calipers across multiple macrofolds 20 (at least 3). Typically, graphite sheet 12 has a length of at least about ten (10%) percent less than the length of the starting graphite sheet 4. Other embodiments, the length of graphite sheet 12 is up to ninety (90%) less than the original length of graphite sheet 4.

A typical pitch for the number of macrofolds for graphite sheet 12 is at least about two ($2T_s$) times the thickness of the starting material, graphite sheet 4. In particular examples, the pitch is at least 50 microns and can be up to 2 mm.

As shown in FIGS. 4a-4d, the creped graphite sheet 12 can be formed by a creping process to create the macrofolds 20 and microfolds 22 described above. In the creping process, as shown the flexible graphite sheet 4 is disposed on the surface 38 of an optional carrier 40. In one or more examples, the carrier surface 38 has a sufficiently high friction to resist movement of the graphite along the carrier surface to enable the graphite 4 to be creped as described in further detail below.

In one or more other examples, the graphite 4 is bonded to the carrier surface 38 forming an adhesive bond having a sufficiently high adhesion to resist movement of the graphite 4 along the carrier surface 38 to enable the graphite to be creped as described in further detail below.

Figure 5:
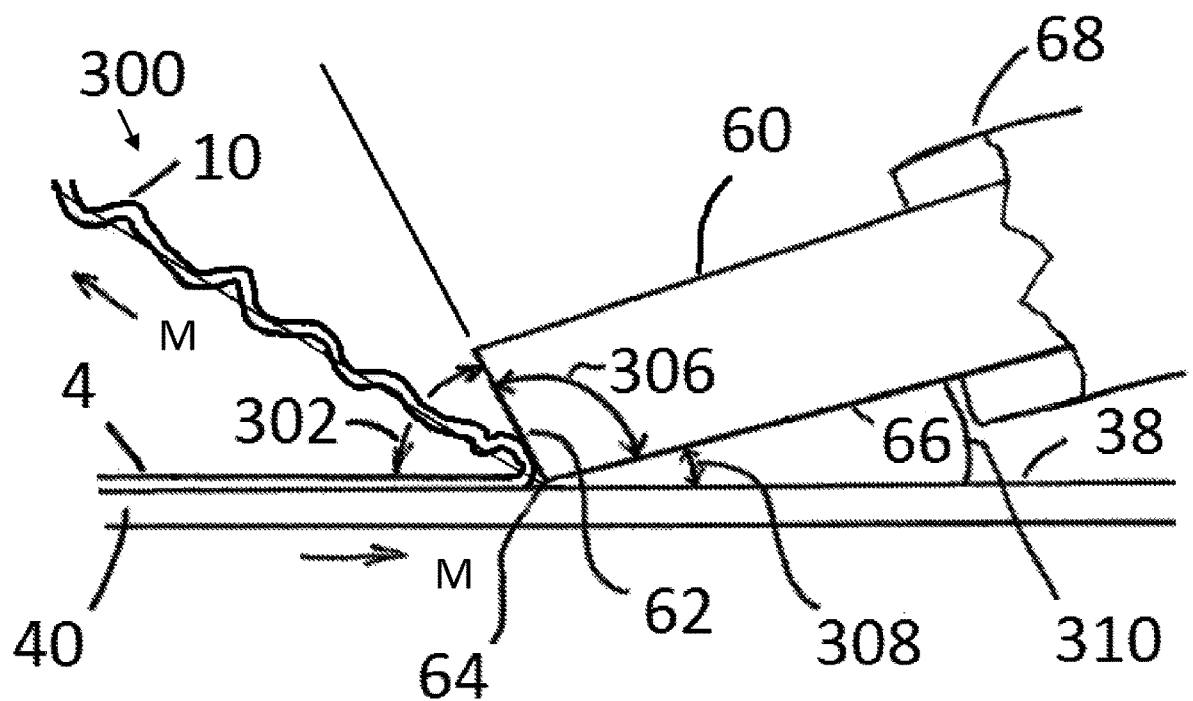
FIG. 5 illustrates a crepe pocket formed by a doctor blade creping a flexible graphite sheet on a flat carrier.
Figure 6:
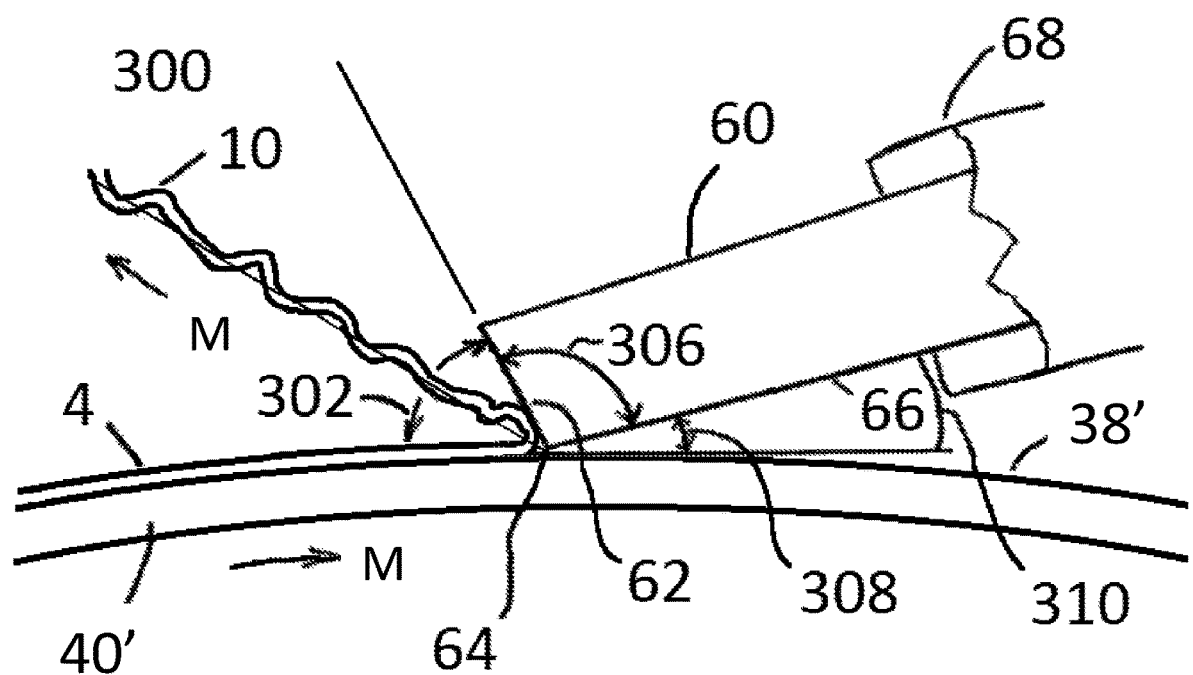
FIG. 6 illustrates a crepe pocket formed by a doctor blade creping a flexible graphite sheet on a cylindrical Yankee carrier.

The carrier surface 38 can be flat, as shown in FIG. 5. In other examples the optional carrier can be the surface of a Yankee cylinder 40' having a cylindrical carrier surface 38' as shown in FIG. 6. The carrier is typically slightly wider than the full width of the sheet 4. The cylindrical surface 38' forms a counternip to a press roll or rolls (not shown) and provides the platform upon which the crepe occurs.

In one or more other examples, the carrier can be a liner. The graphite 4 can be bonded to the liner, such that the adhesive attachment between the graphite and the liner resists scraping so as to crepe the graphite as described in further detail below.

A blade, referred to as a doctor blade 60, is brought into contact with the carrier surface 38 to scrape graphite from the carrier surface in a controlled process referred to as creping. The doctor blade 60 has a width measured in the cross-process direction which is wider than the width of the graphite sheet 4. A variant of this process may include doctor blade 60 may be a gapped (AKA notched) blade. This will provide a varying texture to graphite sheet 12; may also be referred to as a striated creped graphite sheet.

Figure 4A:
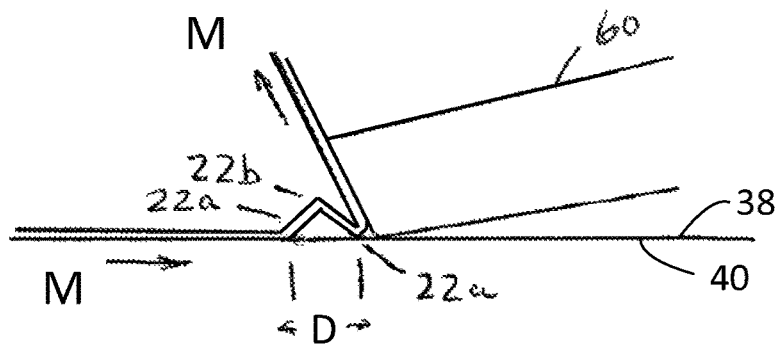
FIGS. 4a-4d illustrate the creping process of a graphite sheet.
Figure 4B:
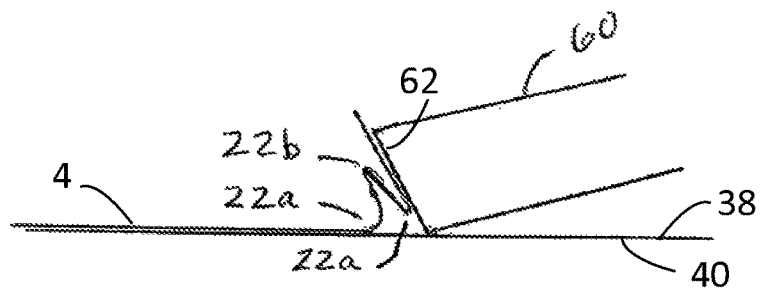
Figure 4C:
Figure 4D:
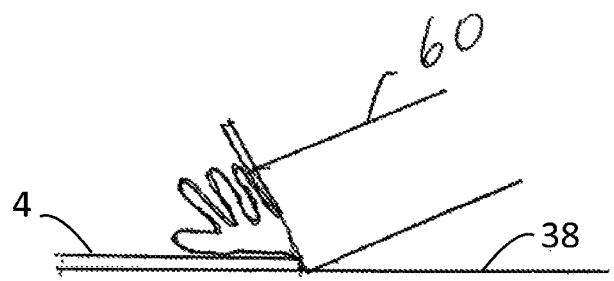

Just prior to reaching the doctor blade, the graphite carbon atoms 3 of the graphite sheet 4 are attached to each other via C—C bonding. One function of creping is to disrupt or shift to orientation of the platelets to allow the sheet to expand in the Z-direction, away from the carrier surface 38 or 38' as the case may be, so that the graphite layer becomes partially separated from the carrier surface, as shown in FIG. 4a. The energy to disrupt these bonds is imparted by the rotating Yankee, or by the moving flat carrier, to which the sheet 4 is firmly held via the adhesive bond formed by the adhesive adhering the graphite to the carrier. While most of the adhesive is separated from the graphite 4, some adhesive may stay with the graphite and bond adjacent folds together. The moving sheet 4 impacts the stationary doctor blade 60 and energy transfer takes place, sufficient to cause partial failure of the C—C bonds and to de-bond graphite 4 from the carrier surface 38 along an interface at the doctor blade sufficient to lift the graphite from the carrier surface and form a microfold 22. In other examples in which the graphite is not bonded to the carrier surface, this energy transfer takes place with partial failure of the C—C bonds alone sufficient to lift the graphite from the carrier surface 38 over a small portion of the carrier surface to form a microfold 22. It should be appreciated that in other examples, the doctor blade 60 can be moved against a stationary graphite sheet 4, or in other examples, the doctor blade 60 and the graphite sheet both move in a direction towards each other.

As well as expanding the sheet in the Z direction, some of the graphite 4 will buckle and bend. Depending upon the adhesive strength and/or the coefficient of friction of the carrier surface 38, the expanded and buckled sheet will release from the carrier surface for a short distance D as shown in FIG. 4a. It should be appreciated that the stronger the adhesive strength and/or the stronger the coefficient of friction of the carrier surface, the shorter this distance D shown in FIG. 4a will be. Thus, a small fold referred to herein as the microfold 22 of graphite crepe is formed before the graphite sheet which is held against the carrier surface 38 re-impacts with the doctor blade surface 62 and the process is restarted.

The completed creped graphite 12 formed of the microfolds 22 of graphite are continually moving away from a crepe pocket formed along the end of the doctor blade 60. The creped graphite 12 can be wound on a reel if so desired. It has been found that the three-dimensional graphite article 10 will not naturally coil itself into a roll without the use of a reel. The creped graphite 12 coils more readily than the uncreped sheet 4 because the web direction flexibility has been enhanced by the creping process just described. A takeup reel may be used, or the resulting material can be allowed to fall into a catch bin to maintain maximum plasticity.

During creping, the graphite sheet 4 is expanded first by Z direction, that is a direction perpendicular to both the process direction (y axis) and the cross-process direction (x axis) as the C-bond disruption occurs and secondly by the crepe action forming the microfolds 22. The creped graphite is not entirely uniformly composed of only microfolds 22. Rather the creped three-dimensional graphite article includes the larger macrofolds 20 interspersed with a plurality of the smaller microfolds 22, as described above.

In other examples, the doctor blade 60 can be moved back and forth in the cross-process direction to create a zig-zag pattern in the graphite of the three-dimensional article 10.

As shown in FIGS. 5 and 6, the geometry of the crepe pocket shown generally at 300 is illustrated in greater detail. The crepe pocket 300 is defined by the pocket angle 302 which is the angle that the blade face 62 forms with the graphite 4 at the line of contact where the blade edge 62 contacts the carrier surface 38. In examples in which the carrier surface 38' is not flat, such as the cylindrical Yankee surface, the pocket angle 302 is formed between the blade face 62 and the tangent taken where the blade edge 62 contacts the carrier surface 38'.

The pocket angle 302 is determined by the blade bevel angle 306 which is the angle the blade face 62 forms with the carrier surface (or tangent thereof) at the point of contact 64. The blade bevel angle 306 is the angle formed between the blade face 62 and the blade base 66. The blade base 66 extends from a blade holder 68 to form a sliding wear angle 308. The sliding wear angle 308 is determined by the blade holder angle 310 minus the blade deflection angle 312. The blade holder angle 310 is formed between the blade base 66 where it exits the blade holder 68 and the carrier surface 38 (or tangent thereof). The sliding wear angle 308 is reduced by the amount of blade deflection at the line of contact 64. The blade deflection is determined in part by the blade material and the length of the blade stickout. The blade stickout is the length of the blade base 66 which extends from the blade holder 68 to the blade edge 62. Examples of materials the blade may be constructed of include metal, ceramic or carbide materials. The blade can be coated with similar materials.

In particular embodiments, the sliding wear angle 308 can range from about 15 degrees to 40 degrees. The final sliding wear angle 308 is constrained in two ways. If it is too low (less than about 15 degrees) then its ability to detach the sheet is impaired and the sheet can bypass or plug the blade leading to a web-break. If the angle is too high (over 40°) then it imparts too much friction against the carrier surface 38 and in carrier surface wear or damage from chattermarks becomes a concern. Thus, a blade holder angle of 17 to 19° is typical, though other angles can be contemplated. In order to achieve a pocket angle which is considered to be relatively more open, the blade can be beveled with bevel angles 306 up to 60°. The more open the crepe pocket is, with pocket angles of >90°, the more the blade tends to produce microfolds having a smaller pitch $P_2$. The amplitude or height H of the macrofolds is typically decreased with a more open pocket angle. A relatively less open crepe pocket, formed by pocket angles of <90°, increases the height H of the macrofolds during creping.

The blade stickout can determine the fine tuning of the pocket angle as blade deflection can open the pocket if the stickout is increased. However, a high stickout can also allow the blade to vibrate more and can also lead to bypassing. A 20-25 mm stickout is a preferred, though a stickout of 15-35 mm can be used, in other examples, a stickout of 10 to 50 mm can be used. To practice the embodiments disclosed herein, the above angles and measurements are exemplary and should not be considered as limiting.

The adhesion of the graphite to the carrier affects the debonding which must be overcome to form the microfolds and macrofolds.

Examples of the adhesive can include an acrylic PSA. The type of PSA contained in the first PSA layer is not particularly limited. This PSA may be a PSA that contains, as a base polymer, one or two or more types selected from among a variety of polymers (PSA polymers) able to function as constituent components of PSAs, such as acrylic polymers, polyesters, urethane-based polymers, polyethers, rubber-based polymers, silicone-based polymers, polyamides and fluorine-based polymers. From perspectives such as PSA performance and cost, a PSA containing an acrylic polymer or a rubber-based polymer as a base polymer can be advantageously used. Of these, a PSA containing an acrylic polymer as a base polymer (an acrylic PSA) is preferred. An explanation will now be given mainly of a mode in which the first PSA layer is a PSA layer constituted from an acrylic PSA, that is, an acrylic PSA layer, but the first PSA layer in the feature disclosed here is not intended to be limited to an acrylic PSA layer.

In other examples, the adhesive can include a silicone layer applied to a PET carrier.

A relatively less strong adhesive will fracture more easily giving a coarse crepe with high crepe amplitude, as measured by H being relatively longer, and low frequency as measured by pitch P being relatively longer. A relatively stronger adhesive will fracture the adhesive bond less easily giving a fine crepe, low amplitude as measured H being relatively shorter, and a high frequency as measured by pitch P being relatively shorter.

The flexible properties of the three-dimensional article 10 make the article well suited for use as a gasket or seal which can withstand high temperatures. Furthermore, the flexible properties enable the article to be stamped, drawn, or pressed to form a greater variety of shapes than typical substantially two-dimensional flexible graphite sheets.

The flexible properties of the three-dimensional article 10 make the article well suited for use as a thermal interface which can withstand high temperatures.

Furthermore, the flexible properties enable the article to be stamped or pressed to form a greater variety of shapes than typical substantially two-dimensional flexible graphite sheets.

Figure 7:
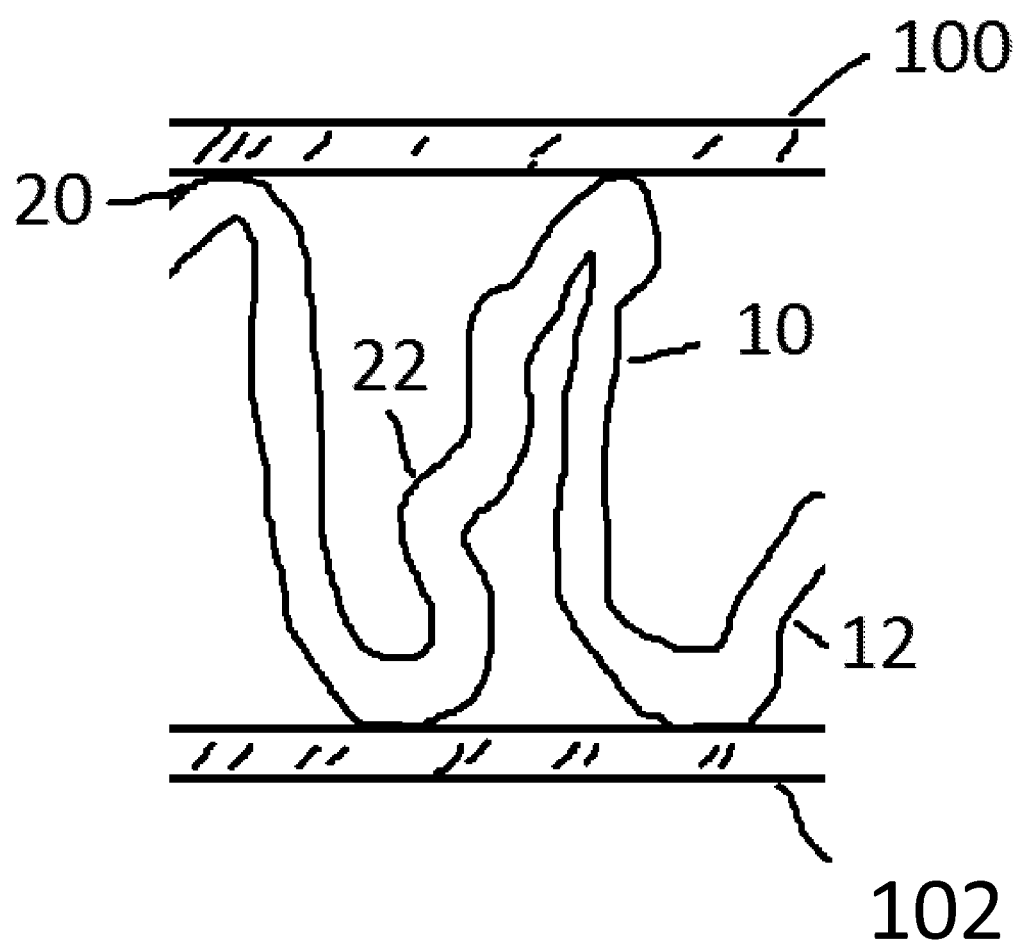
FIG. 7 illustrates a laminated article including a creped graphite article.

The graphite article 12 can be used as a thermal interface. As shown in FIG. 7, a principal function of thermal interface is to form sufficient operative thermal communication of the first surface 14 of the flexible graphite sheet 12 with an external surface of an electronic component to maximize the removal of heat from the heat source at an acceptable contact pressure. The graphite article 10 also provides a second function as a thermal interface which is provide an increased effective surface area of surface of the electronic component, to facilitate heat dissipation from electronic component and, as such, the graphite article 10 acts as a thermal spreader or heat spreader.

Applications for the article may include being used as a thermal interface in such environments as consumer electronics, white goods, drivetrains for automotive, commercial or locomotive vehicles, telecommunications, thermo-electronic devices, and industrial equipment.

The article described herein may have any to all of the following advantages: low contact resistance, excellent thru-thickness thermal conductivity, high in-plane thermal conductivity, relatively high bond line thickness and greater adaptability to varying thickness and roughness than planar graphite sheets. One advantageous is as a large area thermal interface material. Other advantageous of the material include lower thermal resistance, increased compressibility and higher in-plane thermal conductivity than conventional thermal interface materials.

Figure 15A:
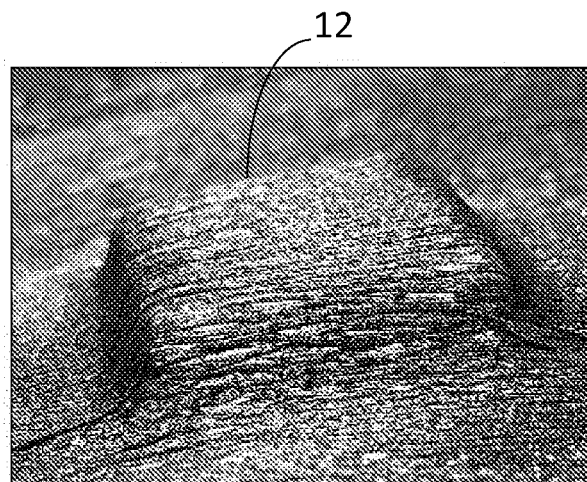
FIGS. 15a-15b illustrate creped graphite sheet drawn or formed into an enclosure.
Figure 15B:
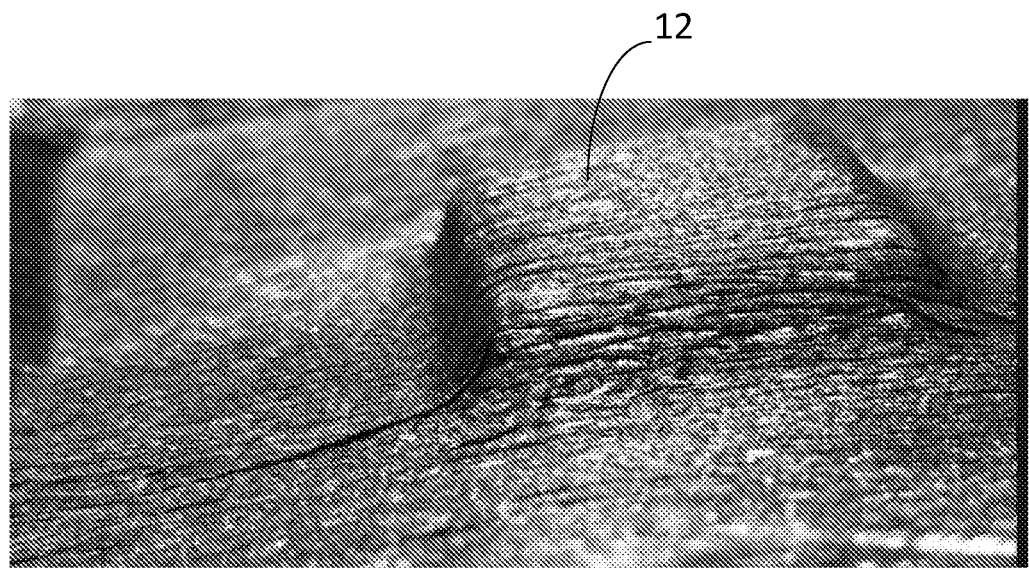
Figure 16:
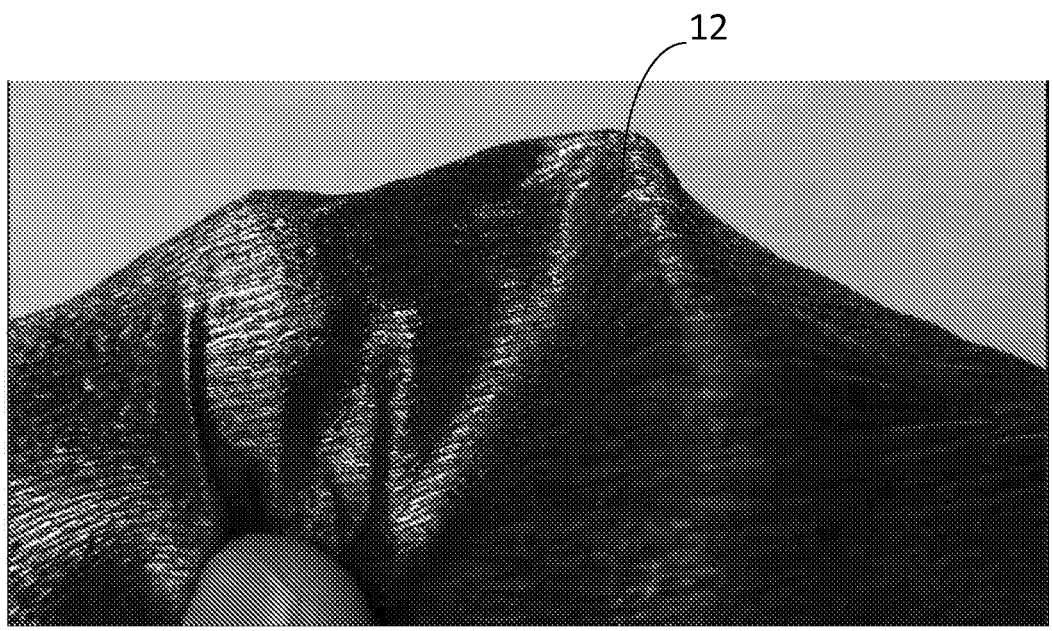
FIG. 16 illustrates a creped graphite sheet being folded.

The graphite article 10 has an increased plasticity as compared to the uncreped graphite sheet 4. The increased plasticity imparts an improved ability for the article 10 to bend, to be molded, to be extruded into a three-dimensional shape, as compared to the graphite sheet 4. The articles plasticity enables it to be drawn around an object or form into an enclosure. Examples of this are shown in FIGS. 15a, 15b and 16.

The graphite article 10 has been formed into an EMI can that simultaneously surrounds and EMI source on 5 sides without any leakage. It also removes heat from that same package and spreads the heat outward along the 6$^{th}$ side.

Graphitized polymer graphite sheet 12 exhibited increased shielding effectiveness over control graphite sheet 4. The graphite sheet 12 was tested in accordance with ASTM test method D4935, Shielding Effectiveness. The creped graphite sheet 12 exhibited an increase in shielding of at least 10 dB over the frequency range of 2 to 6 GHz. Also, the effectiveness of the shielding increased with frequency over such range. Striated graphite sheet 12 (creped with notched doctor blade 60) exhibited a slope of 1.3 dB/MHz over the frequency range, an increase of over about 6-fold over the control graphite sheet 4 and the graphite sheet 12 (creped with a straight doctor blade 60) exhibited a slope of 3.8 dB/MHz over the frequency range, an increase of about 20-fold. Thus, the creped graphite 12 disclosed herein exhibits an increase in shielding effectiveness over the frequency in the range of 2 to 6 GHz wherein a slope of the best fit line has a slope of at least 0.6 dB/MHz, preferably at least 0.8 MHz and more preferably at least 1.0 dB/MHz.

Further the drawn graphite sheet 12 may be clamped without tearing.

The graphite article 12 has excellent impermeability, such that creped graphite 12 can be used to enclose a fluid, as well as other types of matter. Regarding water vapor transmission rate ("WVTR"), may also be referred to as moisture vapor transmission rate ("MVTR"), preferably embodiments may have a WVTR of no more than about 20 gm/m$^2$-day @ 60% RH @ 20° C. Other preferred WVTR's include no more than about 15 gm/m$^2$-day @ 60% RH @ 20° C.; no more than about 10 gm/m$^2$-day @ 60% RH @ 20° C. and no more than about 5 gm/m$^2$-day @ 60% RH @ 20° C. Another embodiment has exhibited an impermeability of less 1.0 gm/m$^2$-day @ 60% RH @ 20° C. Another embodiment has exhibited an impermeability of 0.05 gm/m$^2$-day @ 60% RH @ 20° C. A test method of determining such WVTR is ASTM F-1249.

Regarding oxygen transmission rate ("OTR"), preferred embodiments have an OTR of no more than 150 cc/m$^2$-day-atm @ 23% controlled RH. Other preferred OTRs include no more than 100 cc/m$^2$-day-atm @ 23% controlled RH, no more than 75 cc/m$^2$-day-atm @ 23% controlled RH, no more than 50 cc/m$^2$-day-atm @ 23% controlled RH, and no more than 25 cc/m$^2$-day-atm @ 23% controlled RH and no more than 10 cc/m$^2$-day-atm @ 23% controlled RH. A test method of deterring OTR is ASTM F-1927.

Referring again to FIG. 7, the three-dimensional article can be used to form a laminate comprised of the article disposed between a first material 100 and a second material 102. In one example, the first material is the same as the second material. In other examples, the first material and the second material are different. In the case where two materials are creped, interlocking folds formed by the microfolds and macrofolds enable a Velcro-like connection between upper and lower materials. Upper and lower materials can further be isolated by a creped graphite interface. In this manner materials that might otherwise react with each other or must otherwise be maintained separate from each other can now be interconnected through this thin layer composed of article 10.

Another application of graphite sheet 12 is to form a core of a laminate having 3 or more layers of graphite sheet 12 as such core. For the exterior surface of such laminate, graphite sheet 4 may be used for one or both surfaces. Optionally, different materials may be used for the exterior surfaces of the laminate, such as but not limited to metal foils. The resulting laminate resembles a corrugated plate. Such laminate may have a high bending strength in both the x and y directions of the laminate. Such a laminate may have structural applications.

Starting with the graphitized polymer creped graphite sheet 12, can be used as a core of a multi-layer laminate to thereby increase the strength or thermal conductivity or electrical dielectric characteristics of the laminate. A single layer creped sheet 12 adds strength to the laminate in a similar manner as corrugated paper. The increase in strength has been observed even if creped sheet 12 is not uniform in geometric profile.

The graphite article 10 described herein has a high specific area which is the area of surface 14 or 16 in relation to the area of the footprint occupied by the article 10. The specific area can also be expressed as the surface area of the article when it is stretched-out divided by area occupied by the article 10, also referred to as the footprint. The specific area is generally 3:1 up to 10:1, and in other examples 2:1 up to 20:1

Figure 8:
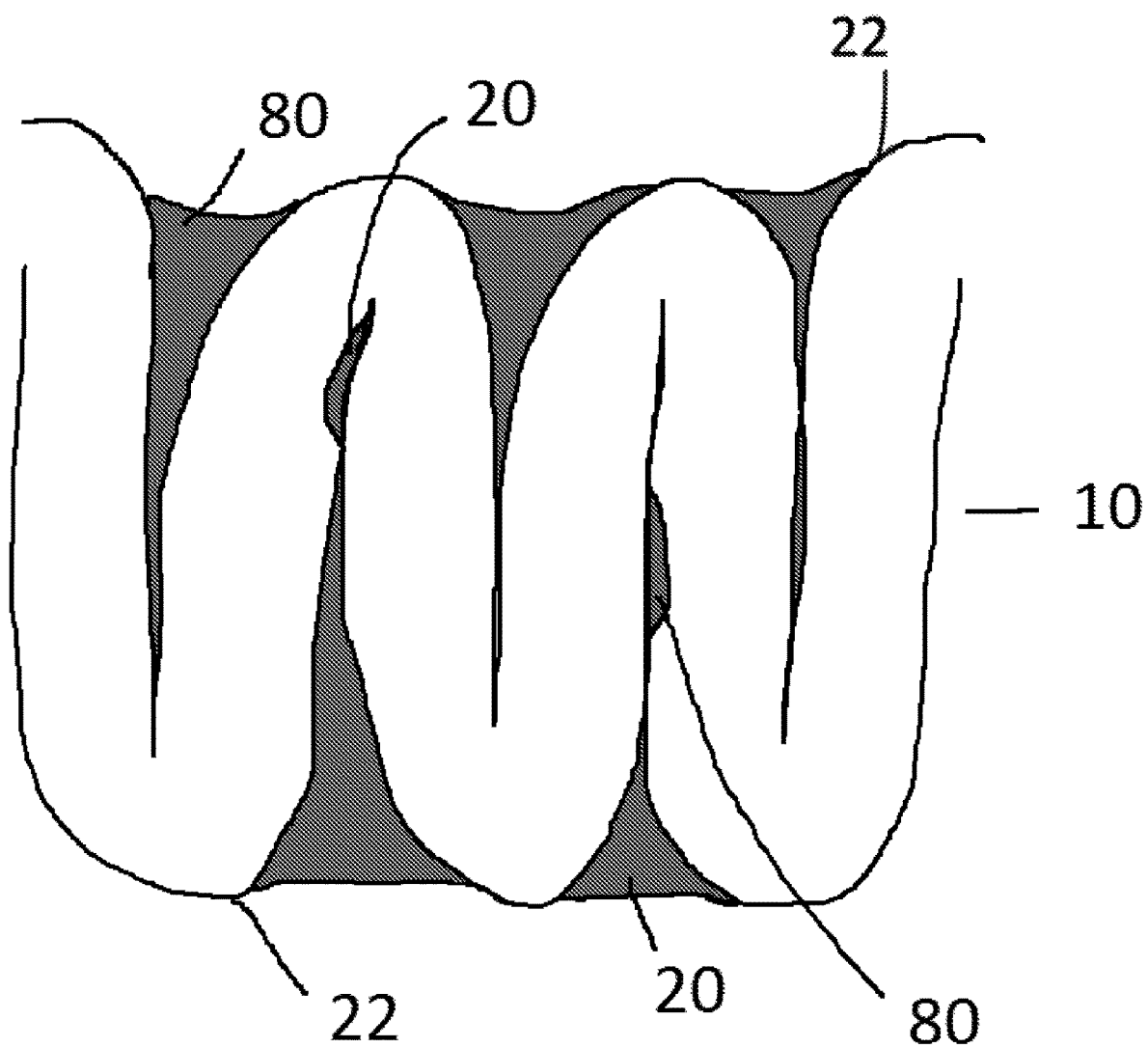
FIG. 8 illustrates liquid retained in the folds of a creped graphite article.

As shown in FIG. 8, the increase in the article's specific area and the narrow channels formed by the microfolds and macrofolds provide bonding regions for liquids such as those used to improve wetting and/or to reduce contact resistance. This can be useful for applications in which the article is used as a thermal interface. Greases as well as oils, such as a fomblin oil, a synthetic oil or other oils can be added to the surface 14 or 16 to improve the thermal conductivity of the article 10. In other examples, the oil used in the present invention includes a wide range of substances including, for example, mineral oil, vegetable oil, animal oil, essential oil, edible oil, synthetic oil like silicon oil, and combinations thereof. The mineral oil for use in the present invention includes, for example, paraffinic mineral oils, naphthenic mineral oils, intermediate-based mineral oils, etc. The mineral oils for use in the present invention are typically petroleum based and include aliphatic, aromatic, and mixed-base oils. Specific examples of mineral oils for use in the present invention include neutral oils, medium-gravity neutral oils, heavy neutral oils, bright stocks, and common lubricants such as engine oil, and medicinal oil such as refined paraffin oil. The vegetable oil used in connection with the present invention may be chiefly derived from seeds or nuts and includes rapeseed, oil, canola oil, soybean oil, corn oil, cottonseed oil, linseed oil, olive oil, tung oil, peanut oil, meadowfoam oil, sunflower oil, soybean oil, safflower oil, jojoba oil, palm oil, castor oil, coconut oil, etc. Vegetable based oil can be obtained, for example, from a genetically modified plant or be modified by water washing, refining, esterification, hydrolysis, etc. The animal oil used in connection with the present invention include fish oils, fish-liver oils, oleic acid, etc. The essential oils used in connection with the present invention include liquids derived from flowers, stems, and leaves, and often the entire plant. These oils may include oil typically used in cosmetics. Additionally, traditional edible oils may be used in connection with the present invention. These oils are derived from fruits, or seeds and plants. Most common are corn, coconut, soybean, olive, cottonseed, and safflower. These oils have varying degrees of saturation. Finally, synthetics oils may be used in connection with the present invention. The synthetic oils are ester type oils, polyalfaolefin oligomers or alkylated benzenes.

Another embodiment of the present invention is a process for preparing a thermal interface material. The process comprises providing graphite article having microfolds and macrofold; providing one of an oil, grease or wax (herein after collectively "Oil") and contacting said Oil with the graphite sheet until from about 2% to about 75% by weight of the Oil is contained in the microfolds and macrofolds.

The fluorinated synthetic oil is added to the creped sheet 12 by contacting the sheet with the fluorinated synthetic oil until the oil is absorbed into the graphite to obtain a creped graphite sheet containing about 2% to about 75% parts by weight oil. In other examples the graphite sheet contains about 2% to about 50% parts by weight oil, in still other examples the graphite sheet contains from about 2% to about 20% by parts by weight oil, in still other examples the graphite sheet contains from about 10% to about 50% parts by weight oil.

Figure 9:
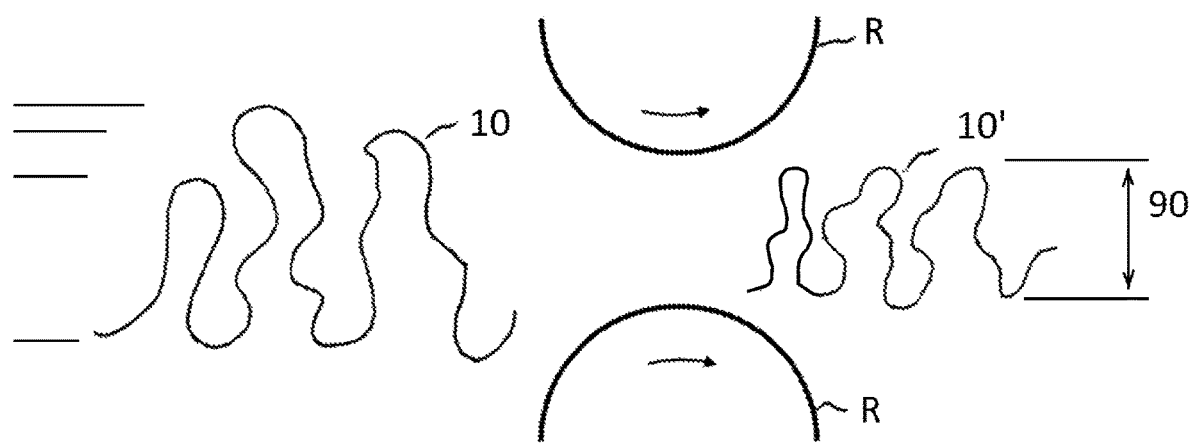
FIG. 9 illustrates calendaring of a creped graphite article to impart a uniform creped sheet thickness.

As shown in FIG. 9, the creped sheet 12 can be calendared between spaced apart rollers R to provide a calendared article 10' having a controlled maximum thickness which is better suited for applications without significantly reducing the compressibility of the article. Calendaring reduces the variation in height $H_1$ between the convex and concave macrofolds shown in FIG. 2. Depending on the roll spacing, this new material 10' may remain highly compressible and conformable, or it may have a higher density. This step is optional.

Dielectric materials such as polyimide or PET can be applied as well, combining the conformability of the elastic graphite crepe with materials with high electrical voltage breakdown characteristics. Alternately, a high flexibility layer of silicone can either fill the voids or be applied to the surface to reduce the electrical conductivity of the composite while enabling the heat flux through the bulk of the graphite composite. The continuous nature of the graphite sheet ensures relatively uniform spacing of the ribbons that connecting the top and bottom surfaces without the need for an additional matrix material.

The creping is distinct from embossing. Embossing compress the material normal to its plane, whereas compression due to creping does not occur normal to the plane of the material being creped.

EXAMPLES

Referring now to FIGS. 11-14, the ability of the creped graphite sheet 12 to withstand tensile stress was tested.

Figure 11:
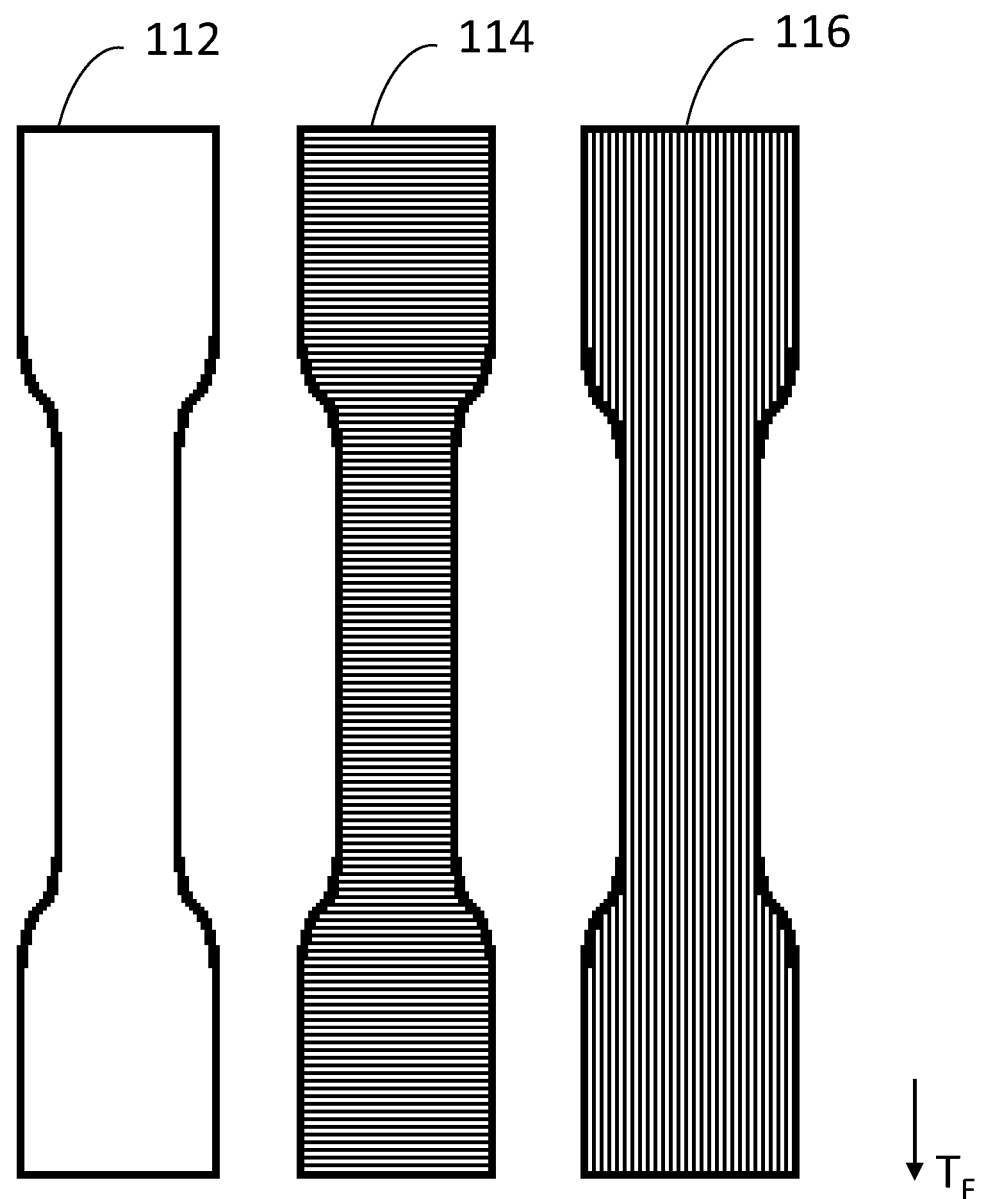
FIG. 11 illustrates tensile strength samples prior to tensile strength testing.
Figure 12:
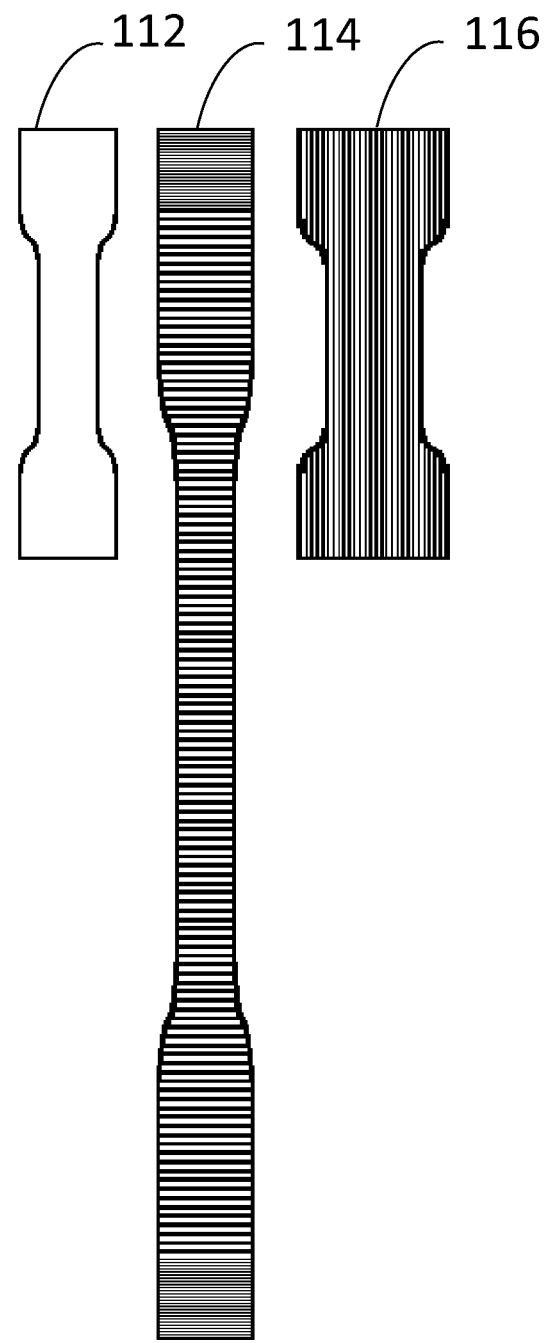
FIG. 12 illustrates the tensile strength samples shown in FIG. 11 after tensile strength testing.

Tensile forces $T_F$ (shown in FIG. 11) were applied for comparison purposes to the graphite sheet 4 used as a control sample shown at 112, and two samples of the creped graphite sheet 12, shown at 114 and 116. The tensile forces $T_F$ were applied in the direction of creping, also referred to as the process direction. FIG. 11 illustrates the samples 112, 114 and 116 before applying the tensile forces $T_F$. FIG. 12 illustrates the samples 112, 114 and 116 after the application of the tensile forces $T_F$.

Figure 13:
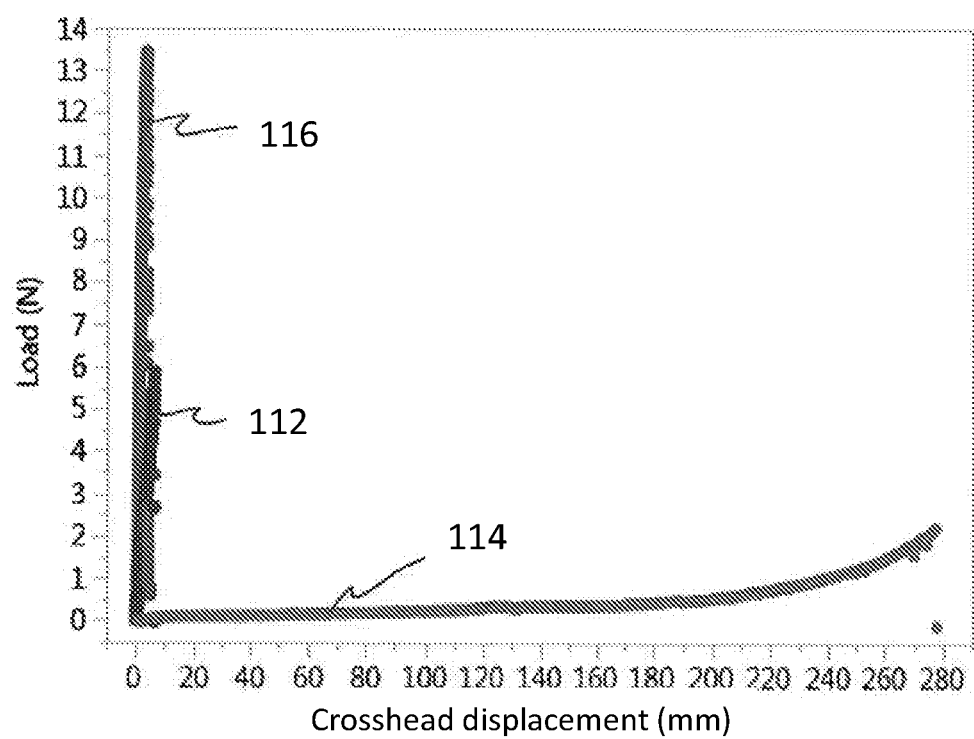
FIG. 13 illustrate the tensile strength testing results of tensile strength testing of samples shown in FIGS. 11 and 12.
Figure 14:
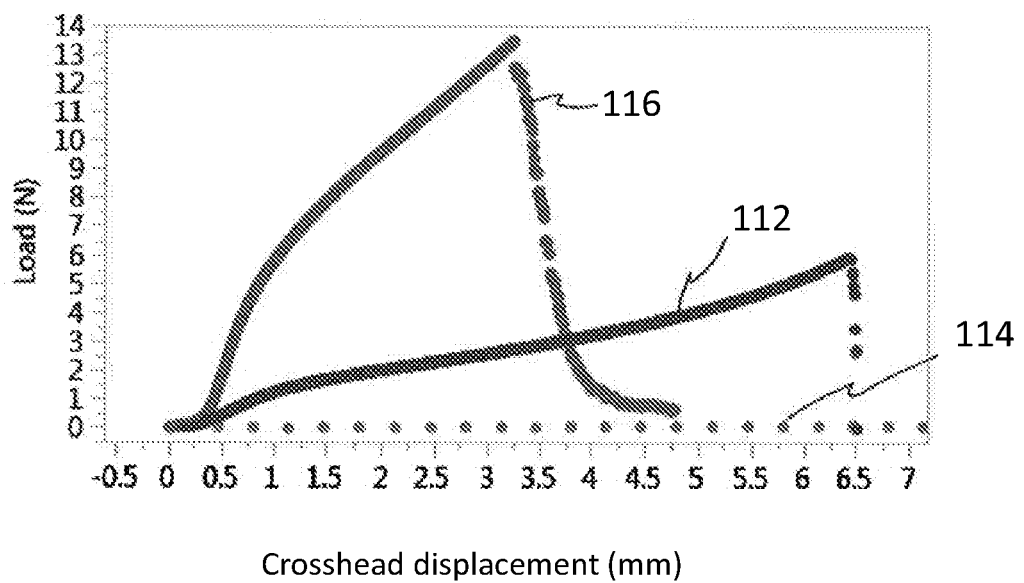
FIG. 14 illustrate a portion of the tensile strength testing results of FIG. 13.

The first sample of the creped graphite sheet 114 included creped macrofolds 20 and microfolds 22 extending generally perpendicular to the applied tensile force $T_F$. The first sample 114 withstood about ½ of the load as graphite sheet 112, as shown in FIGS. 13 and 14. The first sample 114 had the advantage of elongating about 3 times its original length and at least about 50 times more than the control sample 112, as shown in FIG. 12.

The second sample of the creped graphite sheet 116 included creped macrofolds 20 and microfolds 22 extending generally parallel to the applied tensile force $T_F$. The second sample 116 was able to withstand more than twice the load applied to the graphite sheet 112, as shown in FIGS. 13 and 14. The second sample 116 elongated an approximately similar amount, about the same order of magnitude, as the control sample 112. The second sample 116 also increased in width by at least 20% during tensile force application, as shown in FIG. 12.

An MTS/Instron tensile test equipment was used for the above testing. The tensile test procedure was in accordance with the instructions manual for the equipment; it is similar to ASTM D638. All samples 112, 114, and 116 were formed of synthetic graphite. Samples 114 and 116 were formed of roughly four times as much synthetic graphite material as sample 112.

In comparing the thermal impedance of creped and uncreped samples of graphite sheets at pressures of at least 250 kPa, for creped exfoliated graphite sheet 12, the sheet 12 having an increase in thickness of about 4-7.5 times exhibited similar impedance as its uncreped counter-part, e.g., graphite sheet 4. For graphitized polymer graphite sheet 4, the creped sample, creped with a straight doctor blade, exhibited similar impedance at a thickness of about 2.5-4 times that of its uncreped graphite sheet. For graphite sheet 12 creped with a notched doctor blade 60, exhibited twice the thickness or more for a similar thermal impedance. From this test it was noted that striated creped sheets 12 had about ½ the thickness of straight creped sheet 12. The testing was conducted in accordance with ASTM D5470 test method.

Additionally, the thermal impedance of creped graphite sheet 12 was compared to that of some existing gap pads. The existing gap pads tested had about a thickness of at least 500 microns up to about 1 mm. The above ASTM D5470 test was used. The existing gap pads sampled included Fujipoly 100XR-m at 1 mm (uncompressed), Fujipoly 50XR-m at 500 microns (uncompressed). At a pressure of 700 kPa, the creped graphite sheets consistently out-performed the existing gap pads by exhibiting a lower thermal impedance. For natural graphite creped graphite sheet 12, having an uncompressed thickness of about 1 mm, the natural creped sheet 12 exhibited a reduction in thermal impedance between 5-50% over the existing gap pads. For graphitized polymer creped graphite sheets, they exhibited a reduction in thermal impedance of at 0.5 to 2.5 times lower than the controls. This same trend continued for graphitized polymer graphite sheet 12 having a thickness of about 500 microns. The creped sheet exhibited a reduction in thermal impedance of about 2.5 to 4 times that of the control gap pads.

Sample thermal impedance results at 700 kPa contact pressure included less than 0.5° C.*cm²/W, less than 0.35° C.*cm²/W and less than 0.20° C.*cm²/W.

In comparing in-plane diffusivity of the graphitized polymer creped sheet 12, it had an in-plane diffusivity difference of at least 15% between the x and y directions of sheet 12. Non-limiting further examples of the difference in-plane diffusivity of graphitized polymer creped sheet 12 are at least 20%, at least 30%, at least 40% and at least 50%. For exfoliated natural graphite creped sheet 12, the difference in the in-plane diffusivity between the x and y directions of at least five (5%) percent. Non-limiting further examples of the difference in-plane diffusivity for exfoliated natural graphite creped sheet 12 are at least 15%, at least 20%, at least 30%, at least 40% and at least 50%. Such diffusivity was tested on the Bethel TA33 Thermal Analyzer.

Figure 17:
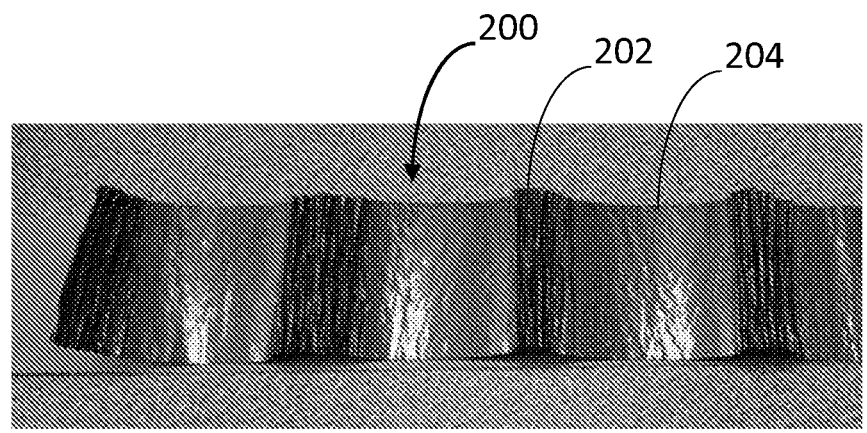
FIG. 17 illustrates a creped graphite sheet forming an article having a section which is creped and a section which is not creped.

Referring now to FIG. 17, a particular embodiment of creped graphite which is of interest is a creped graphite sheet shown generally at 200 having one or more creped sections 202 and one or more uncreped sections 204. One further embodiment is a graphite sheet having only one (1) creped section located between two (2) uncreped sections. Another embodiment is a graphite sheet having only one (1) uncreped section located between two (2) creped sections.

Enumerated examples include:

1. A graphite article comprising: a creped graphite sheet having a first major surface and a second major surface oppositely disposed to the first major surface, the creped graphite sheet having a plurality of macrofolds and a plurality of microfolds, wherein each microfold of the plurality of microfolds adjacent to a macrofold of the plurality of macrofolds has a height smaller than the height of the adjacent macrofold.
2. The graphite article of example 1 wherein the macrofolds include convex folds and concave microfolds.
3. The graphite article of either of examples 1 or 2 wherein the macrofolds includes alternating convex folds and concave microfolds.
4. The graphite article of any one of the preceding examples wherein the macrofolds includes regularly spaced alternating convex folds and concave microfolds having a pitch defined as the distance between at least one of adjacent convex folds and adjacent concave microfolds.
5. The graphite article of any one of the preceding examples wherein the convex folds and the concave microfolds can be seen in viewing the graphite article in cross section.
6. The graphite article of any one of the preceding examples wherein the graphite article further comprises oil contained in the microfolds.
7. The graphite article of any one of the preceding examples wherein the graphite article exhibits elastic and/or plastic properties.
8. The graphite article of any one of the preceding examples wherein the elongation of the article comprises at least 10% of the original length of the article.
9. The graphite article of any one of the preceding examples wherein a difference of in-plane diffusivity in the x-y directions comprises at least 15%.
10. The graphite article of any one of the preceding examples wherein the graphite article comprises a thermal interface.
11. The graphite article of any one of the preceding examples wherein the graphite article exhibits of thermal impedance of less than $0.5°$ C.*cm$^2$/W at a contact pressure of about 700 kPa.
12. The graphite article of any one of the preceding examples having a thickness of at least 0.5 mm.
13. A method of making a three-dimensional article comprising: providing a graphite sheet disposed on a carrier wherein the carrier comprises PET or an adhesive coated surface; orienting a blade to form an angle with the graphite sheet; and scraping the graphite off the carrier using the blade thereby forming repeated microfolds in the graphite sheet.
14. The method of example 13 wherein the microfolds include convex microfolds and concave microfolds.
15. The method of example 13 or 14 wherein the microfolds includes regularly or irregularly spaced alternating convex microfolds and concave microfolds having a pitch defined as the distance between at least one of adjacent convex microfolds and adjacent concave microfolds.
16. The method of any one of preceding examples 13-15 further comprising scraping the graphite off the carrier using the blade thereby forming repeated macrofolds in the graphite sheet.
17. The method article of any one of preceding examples 13-16 wherein the macrofolds includes alternating convex macrofolds and concave macrofolds.
18. An article comprising a creped flexible graphite sheet.
19. The article of example 18 wherein the flexible graphite sheet comprises a sheet of compressed particles of exfoliated graphite sheet and/or a sheet of graphitized polymer.
20. The article of example 18 or 19 wherein the creped flexible graphite sheet has an elongation of at least 10% of its original length.
21. The article of any one of examples 18-20 wherein the article has a difference in in-plane diffusivity in the x-y direction of at least 15%.
22. The article of any one of preceding examples 18-21 wherein the article has a thermal impedance of less than 0.5 (° C.*cm$^2$/W) at a contact pressure of at about 700 KPa.
23. The article of example 18 wherein the creped flexible graphite sheet comprises a monolithic article.
24. The article of example 18 wherein the article comprises an oxygen transmission rate of no more than 150 cc/m$^2$-day-atm@23% controlled Relative Humidity.
25. The article of example 18 wherein the article comprises a moisture vapor transmission rate of no more than 20 gm/m$^2$-day@60% Relative Humidity@20° C.
26. The article of example 18 wherein the article has a thermal impedance of less than 0.5 (° C.*cm$^2$/W) at a contact pressure of at about 700 KPa.
27. The article of example 18 further comprising a thermoplastic layer forming an exterior or an interior layer of the article.
28. A creped flexible graphite article per se.

The above description is intended to enable the person skilled in the art to practice the invention. It is not intended to detail all the possible variations and modifications that will become apparent to the skilled worker upon reading the description. It is intended, however, that all such modifications and variations be included within the scope of the invention that is defined by the following claims.

Thus, although there have been described particular embodiments of the present invention of a new and useful applications of a graphite article and how to make such graphite article, it is not intended that such references be construed as limitations upon the scope of this disclosure except as set forth in the following claims. The various embodiments discussed above may be practiced in any combination thereof.

What is claimed is:

1. A graphite article comprising:
a graphite sheet expanded in Z-direction by creping, the creped graphite sheet having a first major surface and a second major surface oppositely disposed to the first major surface, the creped graphite sheet having a plurality of macrofolds, each macrofold having a plurality of associated microfolds, wherein each microfold is smaller than the associated macrofold, wherein the Z-direction is perpendicular to the plane of the creped graphite sheet, and wherein the plurality of macrofolds is nonuniform and/or the plurality of associated microfolds is nonuniform.

2. The graphite article of claim 1 wherein the macrofolds comprise convex macrofolds and concave macrofolds.

3. The graphite article of claim 1 wherein the macrofolds comprise alternating convex macrofolds and concave macrofolds.

4. The graphite article of claim 1 wherein the thickness (Tc) of the creped graphite sheet is 50 microns to 2 mm.

5. The graphite article of claim 1 wherein the height (H) of the graphite article is more than 100 times greater than the thickness (Tc) of the creped graphite sheet.

6. The graphite article of claim 1 wherein a macrofold comprises more than two microfolds.

7. The graphite article of claim 1 wherein the height ratio between at least one of the macrofolds and at least one of the microfolds is at least 3:1.

8. The graphite article of claim 1 arranged in a three-dimensional shape having a Z-direction measurement of at least 0.5 mm.

9. The graphite article of claim 1 wherein the graphite article further comprises oil contained in the macrofolds.

10. The graphite article of claim 1 wherein the graphite article exhibits elastic and/or plastic properties.

11. The graphite article of claim 1 wherein an elongation of the graphite article comprises at least 10% of the original length of the graphite article.

12. The graphite article of claim 1 wherein a difference of in-plane diffusivity in the x-y directions comprises at least 15%.

13. The graphite article of claim 1 wherein the graphite article comprises a thermal interface.

14. The graphite article of claim 1 wherein the graphite article exhibits a thermal impedance of less than $0.5°$ C.$*$cm$^2$/W at a contact pressure of about 700 kPa.

* * * * *